United States Patent
Armbrust et al.

(10) Patent No.: US 6,251,775 B1
(45) Date of Patent: Jun. 26, 2001

(54) SELF-ALIGNED COPPER SILICIDE FORMATION FOR IMPROVED ADHESION/ELECTROMIGRATION

(75) Inventors: Douglas S. Armbrust, Colchester; Margaret L. Gibson, Underhill; Laura Serianni, Milton; Eric J. White, Charlotte, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/298,796

(22) Filed: Apr. 23, 1999

(51) Int. Cl.[7] .................................................... H01L 21/44
(52) U.S. Cl. .......................... 438/644; 438/612; 438/617
(58) Field of Search .................................. 257/780–781, 257/612, 617, 644; 438/461–464

(56) References Cited

U.S. PATENT DOCUMENTS

| | | | |
|---|---|---|---|
| 4,505,029 | * 3/1985 | Owyang et al. | 427/89 |
| 5,447,887 | 9/1995 | Filipiak et al. | |
| 5,503,704 | * 4/1996 | Bower et al. | 427/399 |
| 5,633,047 | * 5/1997 | Brady et al. | 427/437 |
| 5,833,758 | * 11/1998 | Linn et al. | 134/1.2 |
| 5,844,317 | * 12/1998 | Bertolet et al. | 257/773 |
| 6,046,101 | * 4/2000 | Dass et al. | 438/791 |

OTHER PUBLICATIONS

IBM Technical Disclosure, Cronin et al., "Copper/Polyimide Structure with Selective Cu3Si/SiO2 Etch Stop", vol. 37, No. 06A Jun. 1994, p. 53.

* cited by examiner

Primary Examiner—Charles Bowers
Assistant Examiner—Thanh T. Nguyen
(74) Attorney, Agent, or Firm—McGinn & Gibb, PLLC; Howard J. Walter, Esq.

(57) ABSTRACT

A method for forming a semiconductor structure includes supplying a structure having an exposed last metalization layer, cleaning the last metalization layer, forming a silicide in a top portion of the last metalization layer and forming a terminal over the silicide.

16 Claims, 1 Drawing Sheet

SELF-ALIGNED COPPER SILICIDE FORMATION FOR IMPROVED ADHESION/ELECTROMIGRATION

BACKGROUND OF THE INVENTION

1. Field of the Invention

The present invention generally relates to methods for increasing the adhesion of a terminal to the top copper wiring level in semiconductor devices.

2. Description of the Related Art

Conventional systems have improved the adhesion of silicon nitride to an interior copper wiring surface by the addition of an intervening copper silicide layer. For example, as described in U.S. Pat. No. 5,447,887 to Filipiak et al., hereinafter "Filipiak" (incorporated herein by reference), the connections of internal levels within a semiconductor device are improved with an intervening copper silicide layer.

The silicide layer is conventionally formed within a plasma enhanced chemical vapor deposition (PECVD) reaction chamber by introducing silane ($SiH_4$) in the absence of a plasma into the chamber. The silane reacts with exposed copper surfaces to form copper silicide. After a sufficient thickness of copper silicide is formed, plasma is generated and gases are introduced into the reaction chamber for deposition of silicon nitride onto the device, including onto the copper silicide layer. The intervening copper silicide layer acts as an adhesion layer between the silicon nitride and the copper.

Filipiak teaches that a silicide layer approximately 100 angstroms (100 Å) thick is sufficient to significantly increase the adhesion between the nitride and copper. More specifically, Filipiak explains that, as a general rule, the thickness of a silicide layer should not exceed 10% percent of the total thickness of the copper. A reason for limiting the thickness of the silicide layer to less than 10% of the total copper thickness is that the silicide degrades the resistivity of the copper. While generally the silicide layer should not exceed 10% of the total thickness of the copper interconnect, Filipiak shows that a silicide layer thinner than 100 angstroms (100 Å) or less than 2% of the total copper thickness is sufficient to significantly improve the adhesion of a subsequently deposited PECVD silicon nitride film to the copper member.

However, Filipiak's method is limited specifically it does not provide sufficient coverage or uniformity and, consequently, it does not provide the required adhesion strength for the terminal layer to remain connected to the last metalization (LM) layer. The invention described below solves the above problem.

SUMMARY OF THE INVENTION

It is, therefore, an object of the present invention to provide a structure and method of forming a semiconductor structure that includes supplying a structure having an exposed last metalization (LM) layer, cleaning the last metalization layer, forming a silicide in a top portion of the last metalization layer and forming a terminal over the silicide.

The last metalization layer can be copper. The cleaning is performed by applying an ammonia plasma and a hydrogen plasma to the last metalization layer. The silicide is formed in the top 10% to 20% of the thickness of the last metalization layer. The forming of the terminal includes forming a lead and tin solder terminal electrically connected to the silicide. The forming of the terminal comprises forming a silicon nitride layer physically connected to the silicide. The silicon nitride layer includes an opening allowing direct electrical contact with the silicide. The structure includes insulating layers above the silicon nitride layer.

The semiconductor device has at least two levels of interconnecting metallurgy, and includes a first level of substantially silicide free metallurgy and an uppermost layer of metallurgy including a bonding pad, wherein a top of the uppermost layer includes a silicided surface. The interconnecting metallurgy is copper. Prior to formation of the silicided surface, the uppermost layer is cleaned by applying an ammonia plasma and a hydrogen plasma. The silicided surface comprises the top 10% to 20% of the uppermost layer. The semiconductor device further includes a lead or tin solder terminal electrically connected to the silicided surface. A silicon nitride layer is connected to the silicide and includes an opening allowing direct electrical contact with the silicided surface.

The invention reduces such delamination by forming the silicide layer over the last metalization layer to generally at least 10–20% the thickness of the LM layer. This extensive silicide formation is required at the LM level to resolve the copper/nitrite adhesion issues discussed above. Also, because the last metalization layer comprises very thick metallurgy, it is substantially less sensitive to to resistivity shifts and therefore, the resistivity problems noted with conventional copper silicide (CuSi) systems is avoided. The improved surface coverage provided by the invention enables less resistivity shift per percent thickness of LM layer formation.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

As described above, the conventional methods for improving adhesion between interior copper wiring layers and adjacent insulating layers do not provide sufficient reliability of the terminal layer (e.g., the C4 layer) over the last metalization (LM) layer. The invention solves this problem by cleaning the exposed copper wiring layer and increasing the thickness of the silicide layer above 10%.

Special problems exist with the adhesion of the last metalization layer because the last metalization layer is subject to higher levels and different forms of stress than are the other metalization lawyers within the structure. For example, the last metalization is often physically connected to a solder ball terminal layer which is used to make electrical and physical contact to exterior structures. The exterior structure moves differently (through physical movement) and may have different thermal coefficients of expansion which tends to place high levels of stress (including shearing forces) on the last metalization layer. Therefore, delamination of the silicon nitride from the last metalization layer is more common than delamination within the semiconductor structure. Conventional solutions to this problem involve forming additional masking levels and patterning addition non-copper layers to reduce the stress between the copper and LM nitride. These solutions are costly, add significant cycle time and do not directly address the weak Cu-nitride interface which is responsible for the LM delamination.

The invention reduces such delamination by forming the silicide layer over the last metalization layer to generally at least 10–20% the thickness of the LM layer. This extensive silicide formation is required at the LM level to resolve the copper/nitrite adhesion issues discussed above. Also, the last metalization layer generally comprises very thick metallurgy, and is, therefore, substantially less sensitive to resistivity shifts. Thus, with the invention the resistivity problems noted with conventional copper silicide (CuSi) systems is avoided. The improved surface coverage provided by the invention enables less resistivity shift per percent thickness of LM layer formation.

Figure 1:
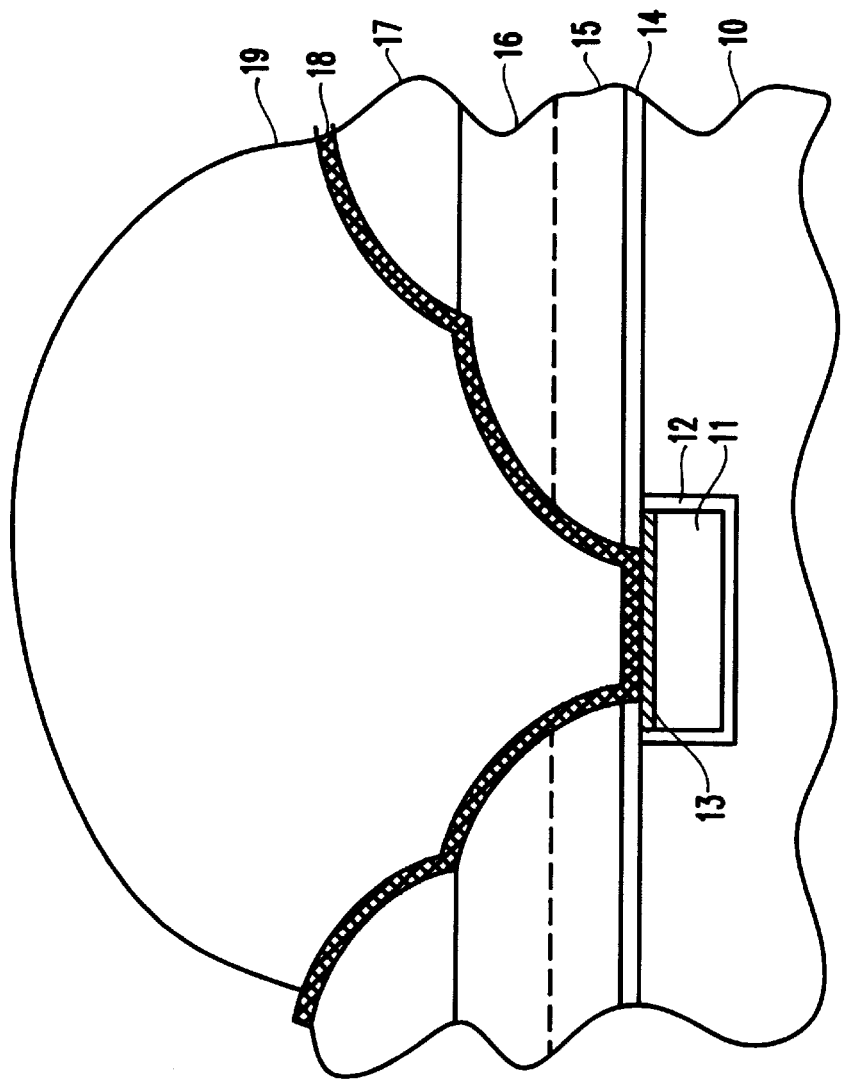
FIG. 1 is a schematic diagram of a last metalization layer and terminal connection.

Referring now to FIG. 1, a cross section of the last metalization layer of a semiconductor device is illustrated. More specifically, FIG. 1 illustrates an insulating layer 10, such as a silicon dioxide layer, which insulates the structure shown from underling wiring layers. A wiring pattern 11 is positioned within the insulator 10. For example, the wiring pattern 11 comprises copper or other similar conductive material.

An important aspect of the invention is that the wiring pattern 11 is the last metalization layer (LM) of a semiconductor structure. As is well known to those ordinarily skilled in the art, the last metalization layer is often substantially thicker than the underlying metalization layers. The additional thickness of the last metalization layer allows the invention to form a thicker silicide layer without incurring the penalties associated with increased resistivity.

The sides and bottom of the last metalization layer 11 are separated from the insulator 10 by a conductor 12 such as Tantalum or Tantalum Nitride.

The underlying structure and the insulator 10, last metalization layer 11 and conductive layer 12 are formed using methods well known to those ordinarily skilled in the art. For example, a pattern of openings can be formed in the insulator 10, using conventional lithographic and etching techniques. The openings formed by the lithographic process can then be lined with the liner 12 using conventional deposition processes, such as sputtering, chemical vapor deposition (CVD) and other well-known deposition processes. The photolithographic mask can then be removed leaving the liner 12 only within the wiring openings. The openings are then filled with the conductive material 11 using, for example, chemical vapor deposition, sputtering or other similar metalization processes. The structure can then be planarized to prepare for the subsequent processing.

The invention then cleans the exposed conductor 11 surface. For example, the conductor 11 surface could be cleaned using any well-known cleaning process such as ammonia ($NH_3$) or ($H_2$) hydrogen plasma enhanced chemical vapor deposition (PECVD) process. The plasma could be applied using power within a range of 450W–550W, where the flow rate for $NH_3$ would be approximately 2,700 sccm and the flow rate for $N_2$ 800 sccm, for 10 seconds at a pressure of 2.6 Torr and temperature of 400° C. Alternatively, the conductor 11 surface could be cleaned in a high density plasma (HDP) reactor using a power of 4500W and a flow rate for $H_2$ of 400 sccm for 40 seconds at a pressure of 6 mTorr at a temperature ramped from 0° C. to 365° C.

The cleaning removes any oxidation which may have formed over the conductor 11 and also removes any contaminants which may have been deposited on the conductor 11 during the previous processing and block CuSi formation. The cleaning process reduces or eliminates the formation of silicide islands, which is common with conventional silicide processes. Therefore, the silicide formed according to the invention is more uniform and offers better adhesion than conventional silicide copper structures.

The upper portion of the conductor 11 is then silicided in the same chamber or the structure can be transferred to another chamber so long as a vacuum is maintained to keep the upper surface of the conductor 11 clean. The siuicide layer 13 is formed using conventional silicide processes. For example, Nitrogen is flowed at 1500 sccm and $SiH_4$ is flowed at 15–180 sccm in a chamber having 2.6 Torr pressure and a temperature of approximately 400° C. The processing is continued for a period of time sufficient to form silicide layer 13 and conductor layer 11 (0–180 seconds). Regarding the relative thicknesses, the last metalization layer 11 can be 8000 angstroms thick while the silicide layer 13 can be approximately 1000 angstroms thick.

As is well known to those ordinarily skilled in the art, a wide variety of process conditions can be utilized to silicide a conductor and the foregoing is merely exemplary. As mentioned above, even though the invention forms the silicide layer thicker than the 10% limit which is known conventionally, the resistance problems are avoided because the last metalization layer 11 is substantially thicker than the metalization layers below in the underlying structure.

Further, by cleaning the top of the last metalization layer 11 before forming the silicide, the reaction rate of silicide formation is greatly improved. Also, the cleaning enhances the uniformity of the silicide formation or surface change. This cleaning benefits any silicide formation process but is a requirement for forming a relatively thick CuSi layer that successfully integrates the LM level for copper applications.

However, the cleaning aspect of the invention is not limited to the last metalization layer. Therefore, even the buried wiring layers can benefit from the inventive cleaning process performed prior to the silicide formation. In other words, this aspect of the invention improves the adhesion and reduces delamination of all silicided wiring layers within the structure.

A series of insulating layers is then formed above the silicided layer 13. More specifically, an insulating layer 14 which acts as a Cu diffusion barrier, such as silicon nitride $Si_3N_4$, is then formed using well known conventional processes to a thickness required by the specific application involved. For example, the silicon nitride layer 14 can be formed to a thickness of approximately 700 angstroms. With the invention, the adhesion between the silicon nitride layer 14 and the copper 11 is improved because an interfacial layer (13) has been formed which has greater adhesion strength to copper and to nitride than copper and nitride have to one another.

Similarly additional insulating layers such as silicon dioxide 15 and an additional silicon nitride layer 16 are formed over the insulating layer 14. Then a polymide layer 17 is formed to provide mechanical protection to the chip. The structure is then patterned using well-known methods and techniques. The opening is lined with a conductive material 18 again, using well-known conventional processes. Then, a large conductive terminal 19 (C4 level contact) is formed using a lead (Pb) or Tin (Sb) solder ball to make a terminal connection to exterior devices.

Figure 2:
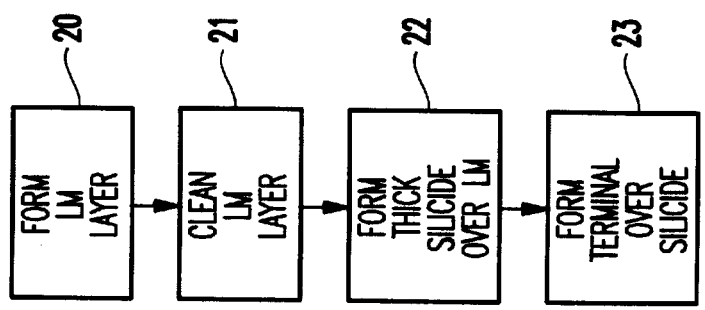
FIG. 2 is a flow diagram illustrating a preferred method of the invention.

The process discussed above is shown in flowchart form in FIG. 2. More specifically, in item 20 the last metalization layer 11 is formed. Then, the last metalization layer 11 is cleaned as shown in item 21. Subsequently the thick silicide layer 13 is formed using the top portion of the last metalization layer 11. Finally, the terminal structure 19 is formed over the silicide 13 as shown in item 23.

As discussed above, last metalization layers present special delamination problems that are not addressed by conventional systems. The invention solves these problems by cleaning the last metalization layer and forming a thick silicide over the last metalization layer. Therefore, the invention produces a structure which is more durable and more reliable than the conventional systems without substantially increasing production cost or altering production processes.

Additionally, the plasma treatment process introduced to clean the conductor prior to silicide formation enables better conformity and starts attractive reaction kinetics which enhances the integratability of conventional silicide systems. Further, electromigration is improved over conventional systems by forming a more continuous self-aligned layer. The invention also inhibits Cu void formation by improving continuity of nitride/copper interface.

While the invention has been described in terms of preferred embodiments, those skilled in the art will recognize that the invention can be practiced with modification within the spirit and scope of the appended claims.

What is claimed is:

1. A method for forming a semiconductor structure comprising:

supplying a structure having an exposed last metalization layer;

cleaning said last metalization layer;

forming a silicide in a top portion of said last metalization layer; and forming a terminal over said silicide, wherein said cleaning comprises applying one of an ammonia plasma and a hydrogen plasma to said last metalization layer at a temperature of approximately 400° C. so as to eliminate formation of silicide islands on said last metalization layer during said forming of said silicide.

2. The method in claim 1, wherein said last metalization layer comprises copper.

3. The method in claim 1, wherein said forming of said sulicide comprises forming said silicide in a top 10% to 20% of a thickness of said last metalization layer.

4. The method in claim 1, wherein said forming of said terminal comprises forming one of a lead and tin solder terminal electrically connected to said silicide.

5. The method in claim 1, wherein said forming of said terminal comprises forming a silicon nitride layer physically connected to said silicide, said silicon nitride layer including an opening allowing direct electrical contact with said silicide.

6. The method in claim 5, wherein said structure includes insulating layers above said silicon nitride layer.

7. The method in claim 1, wherein said cleaning comprises an ammonia ($NH_3$) or ($H_2$) hydrogen plasma enhanced chemical vapor deposition (PECVD) process applied at a temperature of approximately 400° C.

8. The method in claim 7, wherein said PECVD process uses power within a range of 450W–550W, a flow rate for $NH_3$ of approximately 2,700 sccm, a flow rate for $N_2$ of approximately 800 sccm, for approximately 10 seconds, and at a pressure of approximately 2.6 Torr.

9. A method for forming a contact comprising:

supplying a structure having an exposed metalization layer;

cleaning said metalization layer;

forming a silicide in a top portion of said metalization layer; and forming a connection to said silicide, wherein said cleaning comprises applying one of an ammonia plasma and a hydrogen plasma to said metalization layer at a temperature of approximately 400° C. so as to eliminate formation of silicide islands on said metalization layer during said forming of said silicide.

10. The method in claim 9, wherein said metalization layer comprises copper.

11. The method in claim 9, wherein said forming of said silicide comprises forming said silicide in a top 10% to 20% of a thickness of said metalization layer.

12. The method in claim 9, wherein said forming of said terminal comprises forming one of a lead and tin solder terminal electrically connected to said silicide.

13. The method in claim 9, wherein said forming of said terminal comprises forming a silicon nitride layer physically connected to said silicide, said silicon nitride layer including an opening allowing direct electrical contact with said silicide.

14. The method in claim 13, wherein said structure includes insulating layers above said silicon nitride layer.

15. The method in claim 9, wherein said cleaning comprises an ammonia ($NH_3$) or ($H_2$) hydrogen plasma enhanced chemical vapor deposition (PECVD) process applied at a temperature of approximately 400° C.

16. The method in claim 15, wherein said PECVD process uses power within a range of 450W–550W, a flow rate for $NH_3$ of approximately 2,700 sccm, a flow rate for $N_2$ of approximately 800 sccm, for approximately 10 seconds, and at a pressure of approximately 2.6 Torr.

* * * * *